(12) United States Patent
Sugeno et al.

(10) Patent No.: US 9,952,287 B2
(45) Date of Patent: *Apr. 24, 2018

(54) MONITORING APPARATUS, MONITORING CONTROL APPARATUS, POWER SUPPLY APPARATUS, MONITORING METHOD, MONITORING CONTROL METHOD, POWER STORAGE SYSTEM, ELECTRONIC APPARATUS, MOTOR-DRIVEN VEHICLE, AND ELECTRIC POWER SYSTEM

(71) Applicant: Sony Corporation, Tokyo (JP)

(72) Inventors: Naoyuki Sugeno, Fukushima (JP); Morihiko Sato, Fukushima (JP); Koji Umetsu, Miyagi (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 119 days.

This patent is subject to a terminal disclaimer.

(21) Appl. No.: 14/722,752

(22) Filed: May 27, 2015

(65) Prior Publication Data

US 2015/0276882 A1   Oct. 1, 2015

Related U.S. Application Data

(63) Continuation of application No. 13/528,512, filed on Jun. 20, 2012, now Pat. No. 9,046,585.

(30) Foreign Application Priority Data

Jun. 24, 2011 (JP) .................................. 2011-140453

(51) Int. Cl.
H02J 7/00 (2006.01)
G01R 31/36 (2006.01)
H02J 7/04 (2006.01)

(52) U.S. Cl.
CPC ...... *G01R 31/3624* (2013.01); *G01R 31/3648* (2013.01); *G01R 31/3658* (2013.01);
(Continued)

(58) Field of Classification Search
CPC ............. G01R 31/3624; G01R 31/3658; H02J 7/0008; H02J 7/007; H02J 7/04;
(Continued)

(56) References Cited

U.S. PATENT DOCUMENTS 5,822,014 A * 10/1998 Steyer .................. H04N 5/4403
348/569
6,252,375 B1   6/2001 Richter et al.
(Continued)

FOREIGN PATENT DOCUMENTS

CN   101233663   7/2008
JP   11-150880   6/1999
(Continued)

OTHER PUBLICATIONS

Japanese Patent Office, Grounds for refusal notice issued in connection with Japanese Patent Application No. 2011-140453, dated Apr. 1, 2014. (5 pages).

(Continued)

*Primary Examiner* — Paul Dinh
(74) *Attorney, Agent, or Firm* — K&L Gates LLP

(57) ABSTRACT

A monitoring apparatus includes a first converter that converts first analog data indicating a voltage value of each of batteries into first digital data; and a second converter that converts second analog data indicating an electric current value flowing through the plurality of batteries into second digital data. The first analog data and the second analog data are data having the same timing.

20 Claims, 11 Drawing Sheets

(52) U.S. Cl.
CPC ............ *H02J 7/007* (2013.01); *H02J 7/0091* (2013.01); *H02J 7/04* (2013.01); *H02J 7/047* (2013.01)

(58) Field of Classification Search
CPC ....... H02J 7/047; H02J 7/0091; G06F 1/3212; H01M 10/60
USPC .................................................. 320/133–134
See application file for complete search history.

(56) References Cited

U.S. PATENT DOCUMENTS

| | | | |
|---|---|---|---|
| 6,313,637 B1 | 11/2001 | Iino et al. | |
| 6,591,320 B1* | 7/2003 | Cheston | G06F 13/4027 710/104 |
| 7,321,939 B1* | 1/2008 | Porter | G06F 9/546 709/217 |
| 7,839,890 B1* | 11/2010 | Neitzel | H04L 29/06 370/229 |
| 8,280,964 B2* | 10/2012 | Sawant | G06Q 10/02 705/5 |
| 2003/0188206 A1* | 10/2003 | Odaohhara | G06F 1/263 713/300 |
| 2005/0080870 A1* | 4/2005 | Marks | H04L 29/06 709/217 |
| 2006/0139010 A1* | 6/2006 | Wang | G01R 31/3624 320/136 |
| 2006/0158231 A1 | 7/2006 | Soeraasen | |
| 2006/0168213 A1* | 7/2006 | Richardson | G06F 21/552 709/225 |
| 2006/0170398 A1 | 8/2006 | Gangsto et al. | |
| 2006/0290556 A1* | 12/2006 | Sherry | H03M 1/0624 341/156 |
| 2007/0165622 A1* | 7/2007 | O'Rourke | H04L 12/287 370/389 |
| 2008/0278115 A1 | 11/2008 | Huggins | |
| 2009/0252151 A1* | 10/2009 | Rappe | H04L 43/00 370/352 |
| 2009/0287434 A1 | 11/2009 | Su et al. | |
| 2010/0232435 A1* | 9/2010 | Jabr | H04L 12/465 370/392 |
| 2010/0244847 A1* | 9/2010 | Kudo | B60L 3/0046 324/433 |
| 2012/0094154 A1 | 4/2012 | Guoxing | |
| 2012/0162828 A1* | 6/2012 | Holsen | G06F 1/263 361/1 |
| 2012/0166841 A1* | 6/2012 | Holsen | G01R 31/3658 713/323 |
| 2012/0306504 A1* | 12/2012 | van Lammeren | G01R 31/3658 324/430 |

FOREIGN PATENT DOCUMENTS

| | | |
|---|---|---|
| JP | 2003-079504 | 3/2003 |
| JP | 2003-151643 | 5/2003 |
| JP | 2003-307555 | 10/2003 |
| JP | 2005-345124 | 12/2005 |
| JP | 2009-109271 | 5/2009 |
| JP | 2010-086746 | 4/2010 |
| JP | 2010-520733 | 6/2010 |
| JP | 2010-166812 | 7/2010 |
| JP | 2010-249797 | 11/2010 |
| JP | 2011-027608 | 2/2011 |
| JP | 2011-047683 | 3/2011 |
| JP | 2011-106855 | 6/2011 |
| JP | 2012-085522 | 4/2012 |
| JP | 2013-009514 | 1/2013 |
| WO | 2008/108979 | 9/2008 |

OTHER PUBLICATIONS

Japanese Office Action dated Jun. 24, 2014, for corresponding Japanese Appln. No. 2011-140453.
Japanese Office Action dated Aug. 4, 2015 for corresponding Japanese Appln. No. 2014-191652 (14 pages).
Office Action issued in CN Application 2012102037016, dated Dec. 3, 2015 (28 pages).
Japanese Office Action issued in 2016-092744, dated Mar. 21, 2017 (10 pages).
Japanese Office Action issued in 2016-092744, dated May 16, 2017 (10 pages).
Japanese Office Action issued for 2016-092744, dated Oct. 3, 2017 (2 pages).

* cited by examiner

MONITORING APPARATUS, MONITORING CONTROL APPARATUS, POWER SUPPLY APPARATUS, MONITORING METHOD, MONITORING CONTROL METHOD, POWER STORAGE SYSTEM, ELECTRONIC APPARATUS, MOTOR-DRIVEN VEHICLE, AND ELECTRIC POWER SYSTEM

CROSS REFERENCES TO RELATED APPLICATIONS

This application claims priority to and the benefit as a continuation of U.S. patent application Ser. No. 13/528,512 filed Jun. 20, 2012, granted as U.S. Pat. No. 9,046,585, which claims priority to Japanese Priority Patent Application JP 2011-140453 filed in the Japan Patent Office on Jun. 24, 2011, the entire contents of which are hereby incorporated by reference.

BACKGROUND

The present disclosure relates to, for example, a monitoring apparatus, a monitoring control apparatus, a monitoring method, and a monitoring control method that monitor a power supply apparatus having a plurality of batteries. Furthermore, the present disclosure relates to, for example, a power supply apparatus having a plurality of batteries, a power storage system that uses the power supply apparatus, an electronic apparatus, a motor-driven vehicle, and an electric power system.

Applications of lithium ion secondary batteries and the like have expanded to electric power storage devices for storing power, storage cells for automobiles, household electric appliances, which are combined with reproducible energy systems of solar batteries, wind power generation, and the like. In recent years, in order to generate a large output, a battery system in which one or more power storage modules (also called assembled batteries) are connected has been used. Such a power storage module is formed in such a manner that, for example, one or more battery blocks are housed in an exterior case. A battery block is formed in such a manner that a plurality of unit batteries (also called electric cells, simply referred to as batteries as appropriate in the following description), which are examples of power storage elements, are connected to one another.

In the battery system, for example, a voltage value and an electric current value for each battery are detected, and states of batteries and power storage modules are detected by computation operations in which a voltage value and an electric current value are used as parameters. PTL 1 below describes an apparatus that detects a voltage value and an electric current value of a power storage module in an assembled battery for automobiles in such a manner that these detection operations are synchronized with each other.

SUMMARY

The disclosure disclosed in PTL 1 uses a plurality of A/D converters so as to detect a voltage value for each battery. For this reason, there is a problem in that a detection error of a voltage value, which results from variations in the performance of an A/D converter, is necessary to be taken into consideration. In addition, in the disclosure disclosed in PTL 1, an electric current value is detected in synchronization with a timing at which the voltage value of a power storage module formed of 12 batteries is detected. For this reason, there is a problem in that it is not possible to cause the detection timing of the voltage value of an individual battery to be synchronized with the detection timing of the electric current value.

It is preferable to provide a monitoring apparatus and the like, which detects an electric current value flowing through an electric current path at the same time as the timing at which a voltage value for each battery is detected.

In order to solve the above-mentioned problems, the present disclosure provides a monitoring apparatus including:

a first converter that converts first analog data indicating a voltage value of each of batteries into first digital data; and a second converter that converts second analog data indicating an electric current value flowing through the plurality of batteries into second digital data, wherein the first analog data and the second analog data are data having the same timing.

The present disclosure provides a monitoring control apparatus including:

a first converter that converts first analog data indicating a voltage value of each of batteries into first digital data;

a second converter that converts second analog data indicating an electric current value flowing through the plurality of batteries into second digital data; and a control unit that performs control corresponding to the first digital data supplied from the first converter, and the second digital data supplied from the second converter, wherein the first analog data and the second analog data are data having the same timing.

The present disclosure provides a power supply apparatus including:

a plurality of batteries;

a first converter that converts first analog data indicating a voltage value of each of the batteries into first digital data; and a second converter that converts second analog data indicating an electric current value flowing through the plurality of batteries into second digital data, and wherein the first analog data and the second analog data are data having the same timing.

The present disclosure may be a power storage system that includes one or more power supply apparatuses that are shown as an example, wherein the one or more power supply apparatuses are charged by a power generation device that performs electric power generation on the basis of reproducible energy.

The present disclosure may be a power storage system that includes one or more power supply apparatuses that are shown as an example, wherein electric power is supplied to an electronic apparatus connected to the one or more power supply apparatuses.

The present disclosure may be an electronic apparatus that includes one or more power supply apparatuses that are shown as an example, wherein supply of electric power is received from the one or more power supply apparatuses.

The present disclosure may be a motor-driven vehicle that includes one or more power supply apparatuses that are shown as an example, a conversion device that receives supply of electric power from the one or more power supply apparatuses and that converts the electric power into a driving force of the vehicle, and a control device that performs information processing regarding vehicle control on the basis of the information on the one or more power supply apparatuses.

The present disclosure may be an electric power system that includes one or more power supply apparatuses that are shown as an example, and an electric power information transmitting/receiving unit that transmits and receives a signal to and from another device via a network, wherein charging/discharging control of the one or more power supply apparatuses is performed on the basis of the information received by the electric power information transmitting/receiving unit.

The present disclosure may be an electric power system that includes one or more power supply apparatuses that are shown as an example, wherein supply of electric power is received from the one or more power supply apparatuses or electric power is supplied from the one or more power supply apparatuses or a power generation device to the one or more power supply apparatuses.

The present disclosure provides a power supply apparatus including:

a plurality of batteries;

a first converter that converts first analog data indicating a voltage value of each of batteries into first digital data;

a second converter that converts second analog data indicating an electric current value flowing through the plurality of batteries into second digital data; and a control unit that performs control corresponding to the first digital data supplied from the first converter, and the second digital data supplied from the second converter, wherein the first analog data and the second analog data are data having the same timing.

The present disclosure may be a power storage system that includes one or more power supply apparatuses that are shown as an example, wherein the one or more power supply apparatuses are charged by a power generation device that performs electric power generation on the basis of reproducible energy.

The present disclosure may be a power storage system that includes one or more power supply apparatuses that are shown as an example, wherein electric power is supplied to an electronic apparatus connected to the one or more power supply apparatuses.

The present disclosure may be an electronic apparatus that includes one or more power supply apparatuses that are shown as an example, wherein supply of electric power is received from the one or more power supply apparatuses.

The present disclosure may be a motor-driven vehicle that includes one or more power supply apparatuses that are shown as an example, a conversion device that receives supply of electric power from the one or more power supply apparatuses and that converts the electric power into a driving force of the vehicle, and a control device that performs information processing regarding vehicle control on the basis of the information on the one or more power supply apparatuses.

The present disclosure may be an electric power system that includes one or more power supply apparatuses that are shown as an example, and an electric power information transmitting/receiving unit that transmits and receives a signal to and from another device via a network, wherein charging/discharging control of the one or more power supply apparatuses is performed on the basis of the information received by the electric power information transmitting/receiving unit.

The present disclosure may be an electric power system that includes one or more power supply apparatuses that are shown as an example, wherein supply of electric power is received from the one or more power supply apparatuses or electric power is supplied from a power generation device or an electric power network to the one or more power supply apparatuses.

The present disclosure provides a monitoring method for use with a monitoring apparatus including a first converter and a second converter, the monitoring method including:

converting, by using the first converter, first analog data indicating a voltage value of each of batteries into first digital data; and converting, by using the second converter, second analog data indicating an electric current value flowing through the plurality of batteries into second digital data, and wherein the first analog data and the second analog data are data having the same timing.

The present disclosure provides a monitoring control method for use with a monitoring apparatus including a first converter, a second converter, and a control unit, the monitoring control method including:

converting, by using the first converter, first analog data indicating a voltage value of each of batteries into first digital data; and converting, by using the second converter, second analog data indicating an electric current value flowing through the plurality of batteries into second digital data; and performing, by using the control unit, control corresponding to the first digital data supplied from the first converter, and the second digital data supplied from the second converter, wherein the first analog data and the second analog data are data having the same timing.

According to at least one embodiment, it is possible for a power storage module to detect an electric current value flowing through an electric current path at the same time as the timing at which a voltage value for each battery is detected.

Additional features and advantages are described herein, and will be apparent from the following Detailed Description and the figures.

DETAILED DESCRIPTION

A description will be given below of embodiments of the present disclosure with reference to the drawings. The description will be given in the following order.
1. Embodiment
2. Modification
3. Application Example Embodiments, modifications, and application examples, which will be described below, are preferred specific examples of the present disclosure, and the present disclosure is not limited to these embodiments, modifications, and application examples.

1. Embodiment

Configuration of Battery System

Figure 1:
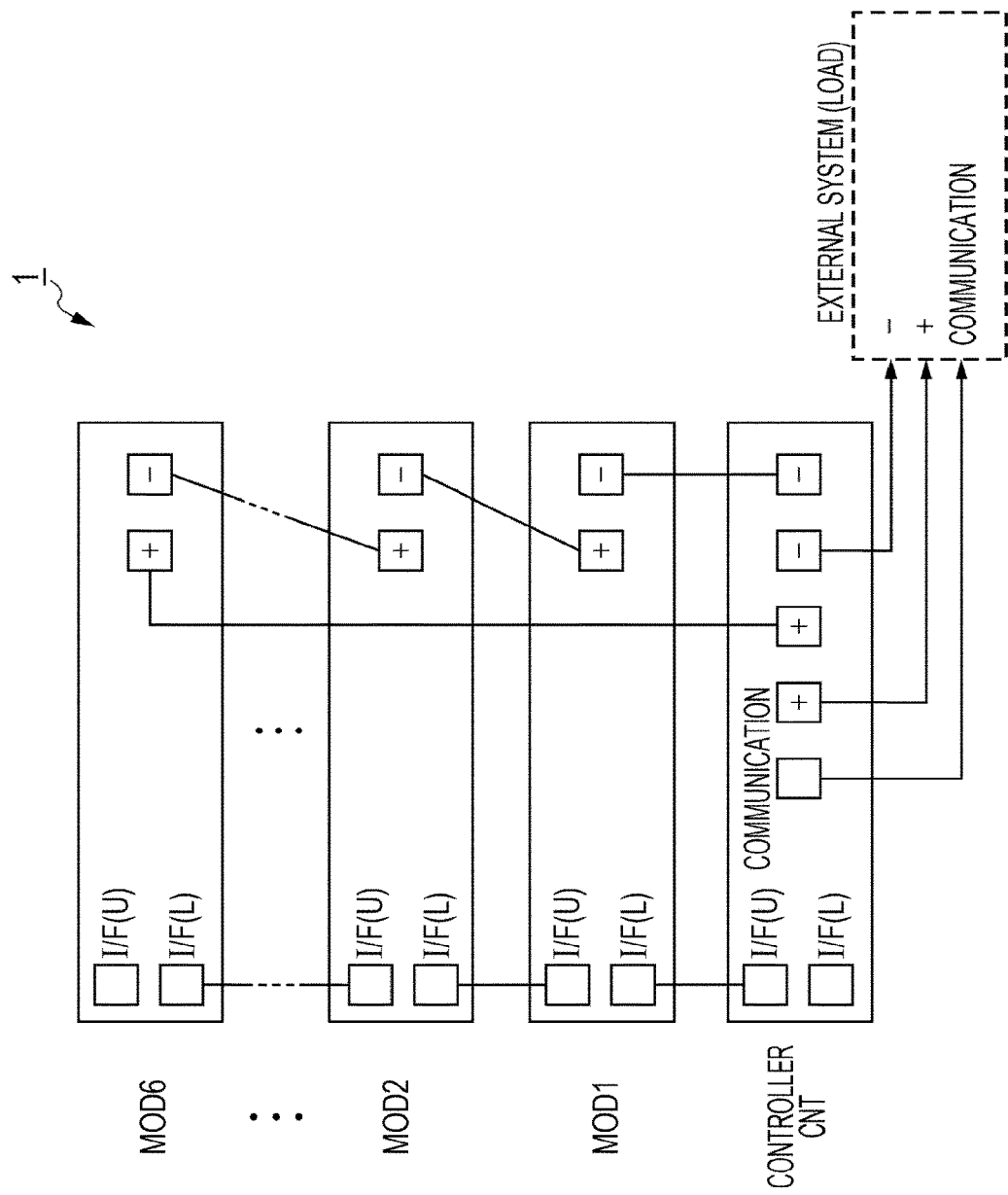
FIG. 1 is a schematic line diagram illustrating an example of the configuration of a battery system in the present disclosure.

FIG. 1 illustrates an example of the configuration of a battery system in an embodiment of the present disclosure. A battery system 1 includes a plurality of power storage modules, and a controller CNT. In the example shown in FIG. 1, the battery system 1 includes a power storage module MOD1, a power storage module MOD2, a power storage module MOD3, . . . , and a power storage module MOD6, that is, six power storage modules.

When it is not particularly necessary to distinguish among individual power storage modules, they will be referred to as power storage modules MOD as appropriate.

The battery system 1 is connected to an external system (load) through the controller CNT.

Electric power is supplied from the battery system 1 to the external system, and communication in compliance with a standard, such as, for example, RS-232C (Recommended Standard 232 version C) or CAN (Controller Area Network) is performed between the battery system 1 and the external system. The external system is set up in accordance with the intended application of the inverter circuit of the motor system in an electric automobile, and with the intended application of the battery system 1, such as an electric power system for a house.

In the battery system 1, six of the power storage modules MOD1 to the power storage module MOD6 are connected in series with one another. The number of power storage modules MOD and the way in which the power storage modules MOD are connected to one another can be changed as appropriate. For example, N power storage modules MOD, which are connected in series with one another, may be connected in parallel with one another. The positive pole terminals and the negative pole terminals of the power storage modules MOD are connected to one another by using power cables. For example, the positive pole terminal of the power storage module MOD2 is connected to the negative pole terminal of the power storage module MOD3, which is a power storage module at a higher level. The negative pole terminal of the power storage module MOD2 is connected to the positive pole terminal of the power storage module MOD1, which is a power storage module at a lower level. The negative pole terminal of the power storage module MOD1 at the lowest level and the positive pole terminal of the power storage module MOD6 at the highest level are each connected to the controller CNT.

The power storage module MOD includes an exterior case. It is preferable that a material having high conductivity and high emissivity be used for the exterior case. By using a material having high conductivity and high emissivity, it is possible to obtain a superior heat dissipation effect in the exterior case. As a result of obtaining a superior heat dissipation effect, it is possible to suppress an increase in the temperature inside the exterior case. In addition, it is possible to minimize or discard the opening part of the exterior case, and thus high dust-proof/drip-proof characteristics can be realized. For the exterior case, for example, a material, such as aluminum, an aluminum alloy, copper, or a copper alloy, is used.

The power storage module MOD includes a battery block inside the exterior case. The battery block is formed in such a manner that eight cylindrical lithium ion secondary batteries are connected in parallel with one another. Inside the exterior case, for example, 16 battery blocks are connected in series with one another. The number of battery blocks and the way in which the battery blocks are connected to one another can be changed as appropriate. Furthermore, secondary batteries other than lithium ion secondary batteries may be used. When the output voltage per lithium ion secondary battery is set at, for example, 3.2 V, the output voltage per power storage module MOD is about 51.2 V (3.2 V×16). That is, the battery system 1 including six power storage module MODs can supply a voltage of about 307.2 V (51.2 V×6) to the external system.

The power storage modules MOD and the controller CNT are connected through an insulation interface, such as a photocoupler. Communication is performed between the respective power storage modules MOD and the controller CNT through the insulation interface. A control signal transmitted from the controller CNT to a power storage module MOD at a higher level is sequentially transmitted through, for example, a power storage module MOD at a lower level. The control signal may be directly transmitted from the controller CNT to each power storage module MOD. Communication may be performed between a predetermined power storage module MOD and a power storage module MOD at a higher level or at a lower level with respect to the predetermined power storage module MOD.

The controller CNT controls the whole of the battery system 1. For example, the controller CNT receives internal information of the respective power storage modules MOD. The controller CNT performs control of supplying or cutting off charging current or discharging current to the respective power storage modules MOD in accordance with the received internal information.

In addition, the controller CNT performs a process for detecting the state of the individual batteries forming the power storage modules MOD and the battery block on the basis of the internal information of the power storage modules MOD. For example, the controller CNT receives the voltage value of the individual battery, and the electric current value flowing through the electric current path of the power storage module MOD from the power storage module MOD, and detects the deteriorated state of the individual battery by using the voltage value and the electric current value. A process for calculating a state of charge (SOC) may be performed by the controller CNT by using the voltage value and the electric current value. It may be determined by the controller CNT as to whether or not the voltage value of the individual battery is an appropriate value. A process (cell balance control) for making uniform the voltages of a plurality of batteries may be performed by the controller CNT in accordance with the determination result.

Configuration of Power Storage Module MOD

Figure 2:
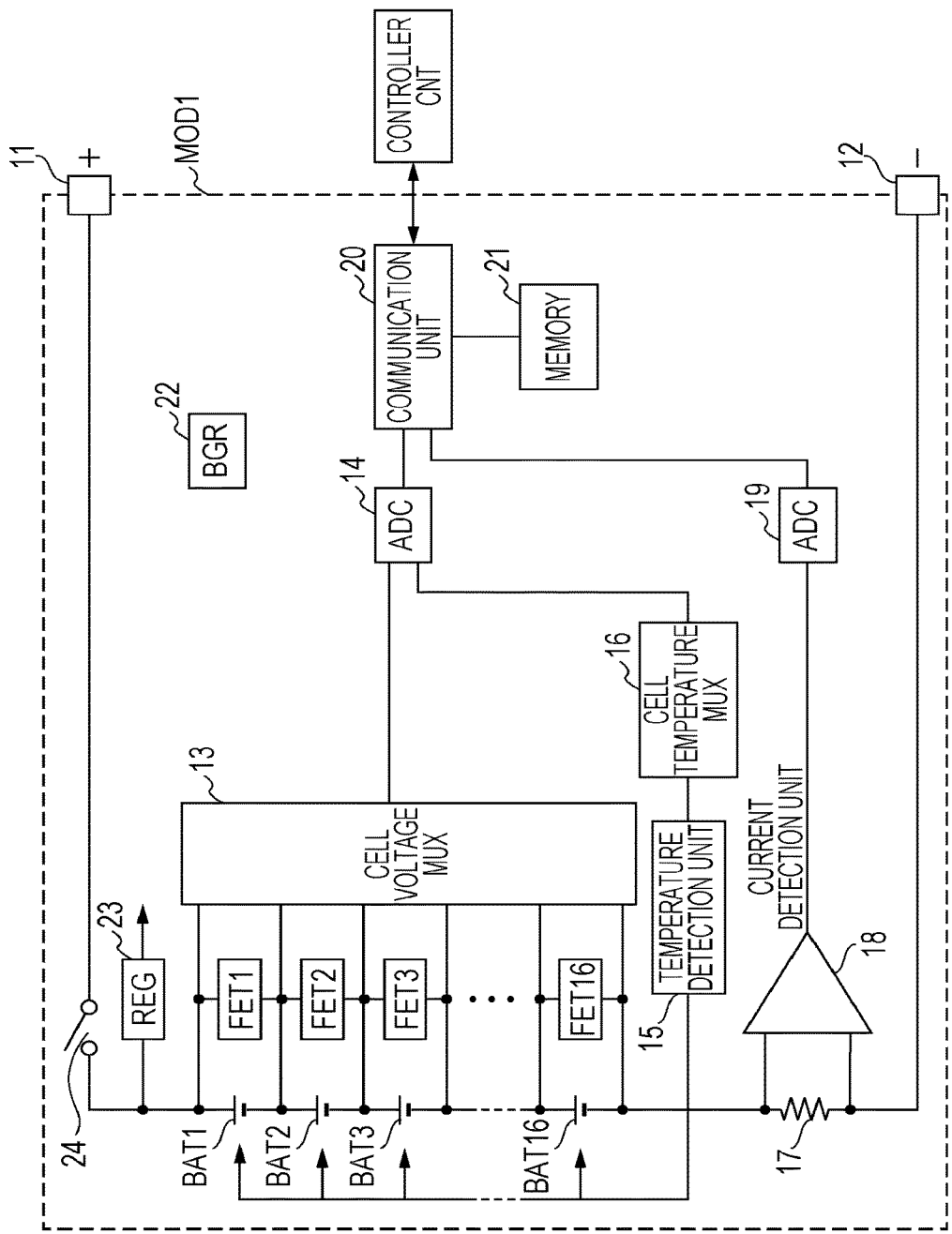
FIG. 2 is a block diagram illustrating an example of the configuration of a power supply apparatus in the present disclosure.

FIG. 2 illustrates an example of the configuration of a power storage module MOD, which is an example of a power supply apparatus. In FIG. 2 the power storage module MOD1 is used as an example. The power storage module MOD2, which is another power storage module MOD, and the like, have the same configuration as the configuration shown in FIG. 2.

The power storage module MOD1 includes, for example, 16 battery blocks BAT1, BAT2, BAT3, . . . , and BAT16, which are connected in series with one another. When it is not particularly necessary to distinguish among the individual battery blocks, they will be referred to as battery blocks BAT as appropriate. In the following description, for the sake of simplicity of description, each battery block is represented using one battery, and the battery block will be simply referred to as a battery.

A battery BAT is, for example, a lithium ion secondary battery. The positive pole side of the battery BAT1 is connected to the positive pole terminal 11 of the power storage module MOD1. The negative pole side of the battery BAT16 is connected to the negative pole terminal 12 of the power storage module MOD1.

An FET (Field Effect Transistor) 1, an FET2, an FET3, . . . , and an FET16 for performing cell balance control of a passive method may be connected between the terminals of the respective batteries BAT. For example, it is assumed that the deterioration of the battery BAT2 has particularly progressed and that the internal impedance of the battery BAT2 has increased. When charging is performed in the power storage module MOD1 in this state, the batteries BAT other than the battery BAT2 are normally charged up to, for example, 3.5 V.

In comparison, since the internal impedance of the battery BAT2 has increased, the battery BAT2 is not charged up to 3.5 V, and is only charged up to, for example, 3.0 V. For this reason, the voltage for each battery BAT differs, and variations occur in the balance between cells. Therefore, in order to eliminate variations in the balance between cells, FETs, which are connected to the batteries BAT other than the battery BAT2, are turned on, and the batteries BAT other than the battery BAT2 are made to be discharged by 0.5 V. After the discharge, the FETs are turned off. After the discharge, the voltages of the batteries BAT become, for example, 3.0 V, and balance among the cells can be achieved. As described above, cell balance control referred to as a passive method may be performed. The method of the cell balance control is not limited to the above-mentioned passive method, and a so-called active method, or other various methods can be applied.

The power storage module MOD1 is provided with a voltage detection unit (not shown) for detecting respective voltages between the terminals of the batteries BAT. The voltage value of the battery BAT is, for example, constantly detected regardless of whether the battery BAT is in the middle of being charged or discharged. The voltage value of the battery BAT may be detected at a predetermined interval.

The voltage value (analog voltage data Vb) of each battery BAT, which is detected by the voltage detection unit, is supplied to a cell voltage multiplexer (MUX) 13. For example, analog voltage data Vb1 indicating the voltage value of the battery BAT1 is supplied to the cell voltage multiplexer 13. Analog voltage data Vb2 indicating the voltage value of the battery BAT2 is supplied to the cell voltage multiplexer 13. Similarly, analog voltage data Vb3 through to analog voltage data Vb16 indicating the respective voltage values of the batteries BAT3 to BAT16, are supplied to the cell voltage multiplexer 13.

The cell voltage multiplexer 13 switches between the channels, for example, in response to a predetermined control signal, and selects one analog voltage datum Vb from among the 16 analog voltage data Vb1 to Vb16. The one analog voltage datum Vb selected by the cell voltage multiplexer 13 is supplied to an analog-to-digital converter (ADC) 14. The predetermined control signal is, for example, a channel switching signal that is supplied from the controller CNT through the communication unit 20.

The power storage module MOD1 is provided with a temperature detection unit 15 for detecting the temperature of an individual battery BAT. A temperature in units of batteries or a temperature in units of battery blocks may be detected by the temperature detection unit 15. The temperature detection unit 15 is formed of a temperature detection element, such as a thermistor. The temperature of the battery BAT is, for example, constantly detected regardless of whether the battery BAT is in the middle of being charged or discharged. The temperature of the battery BAT may be detected at a predetermined interval.

The analog temperature data T indicating the temperature for each battery BAT, which is detected by the temperature detection unit 15, is supplied to a cell temperature multiplexer (MUX) 16. For example, analog temperature data T1 indicating the temperature of the battery BAT1 is supplied to the cell temperature multiplexer 16. Analog temperature data T2 indicating the temperature of the battery BAT2 is supplied to the cell temperature multiplexer 16. Similarly, analog temperature data T3 to T16 indicating the respective temperatures of the batteries BAT3 to BAT16 are supplied to the cell temperature multiplexer 16.

The cell temperature multiplexer 16 switches between the channels in response to a predetermined control signal, and selects one analog temperature datum T from among the 16 analog temperature data T1 to T16. Then, the one analog temperature datum T selected by the cell temperature multiplexer 16 is supplied to the ADC 14. The predetermined control signal is, for example, a channel switching signal that is supplied from the controller CNT through the communication unit 20.

The ADC 14, which is an example of a first converter, converts the analog voltage data Vb supplied from the cell voltage multiplexer 13 into digital voltage data Vb. The ADC 14 converts the analog voltage data Vb into, for example, 14- to 18-bit digital voltage data Vb. For the conversion method in the ADC 14, various methods, such as a sequential comparison method or a ΔΣ (delta sigma) method, can be applied.

The ADC 14 includes, for example, an input terminal, an output terminal, a control signal input terminal to which a control signal is input, and a clock pulse input terminal to which clock pulses are input. The analog voltage data Vb is input to the input terminal. The digital voltage data Vb is output from the output terminal.

For example, a control signal that is supplied from the controller CNT through the communication unit 20 is input to the control signal input terminal. The control signal is, for example, an obtaining instruction signal that instructs obtaining of the analog voltage data Vb supplied from the cell voltage multiplexer 13. When the obtaining instruction signal is input, the ADC 14 obtains the analog voltage data Vb and converts the obtained analog voltage data Vb into digital voltage data Vb. Then, the digital voltage data Vb is output through the output terminal in response to a clock pulse for synchronization, which is input to the clock pulse input terminal. The output digital voltage data Vb is stored in a memory 21.

In addition, an obtaining instruction signal that instructs obtaining of analog temperature data T supplied from the cell temperature multiplexer 16 is input to the control signal input terminal. In response to the obtaining instruction signal, the ADC 14 obtains the analog temperature data T. The obtained analog temperature data T is converted into digital temperature data T by the ADC 14. The analog temperature data T is converted into, for example, 14- to 18-bit digital temperature data T. The converted digital temperature data T is output through the output terminal, and the output digital temperature data T is stored in the memory 21. The details of the operation of the ADC 14 will be described later.

The power storage module MOD1 includes an electric current detection unit for detecting an electric current value flowing through the electric current path of the power storage module MOD1. The electric current detection unit detects the electric current value flowing through a plurality of batteries BAT. The electric current detection unit is formed of, for example, an electric current detection resistor 17 that is connected between the negative pole side of the battery BAT16 and the negative pole terminal 12, and an electric current detection amplifier 18. The electric current detection resistor 17 detects analog electric current data Vc indicating a voltage value across the electric current detection resistor 17. The analog electric current data Vc is constantly detected regardless of whether the battery BAT is in the middle of being charged or discharged. The analog electric current data Vc may be detected at a predetermined interval.

The detected analog electric current data Vc is supplied to the electric current detection amplifier 18. The electric current detection amplifier 18 amplifies the supplied analog electric current data Vc. The gain of the electric current detection amplifier 18 is set at, for example, approximately 50 to 100 times. The amplified analog electric current data Vc is supplied to the ADC 19.

The ADC 19, which is an example of a second converter, converts the analog electric current data Vc supplied from the electric current detection amplifier 18 into digital electric current data Vc. The ADC 19 converts the analog electric current data Vc into, for example, 14- to 18-bit digital electric current data Vc. For the conversion method in the ADC 19, various methods, such as a sequential comparison method or a ΔΣ (delta sigma) method, can be applied.

The ADC 19 includes, for example, an input terminal, an output terminal, a control signal input terminal to which a control signal is input, and a clock pulse input terminal to which clock pulses are input. The analog electric current data Vc is input to the input terminal. The digital electric current data Vc is output from the output terminal.

For example, a control signal that is supplied from the controller CNT through the communication unit 20 is input to the control signal input terminal of the ADC 19. The control signal is, for example, an obtaining instruction signal that instructs obtaining of the analog electric current data Vc that is supplied from the electric current detection amplifier 18. When the obtaining instruction signal is input, the ADC 19 obtains the analog electric current data Vc and converts the obtained analog electric current data Vc into digital electric current data Vc. Then, in response to a clock pulse for synchronization, which is input to the clock pulse input terminal, the digital electric current data Vc is output from the output terminal. The output digital electric current data Vc is stored in the memory 21. The details of the operation of the ADC 19 will be described later.

The communication unit 20 performs communication with the controller CNT. Between the communication unit 20 and the controller CNT, both-way communication in compliance with I2C, which is a standard of serial communication, and a standard, such as SMBus (System Management Bus), SPI (Serial Peripheral Interface), or CAN, is performed.

The communication may be performed in a wired manner or in a wireless manner. The communication unit 20 performs, for example, time-division multiplexing on the digital voltage data Vb and the digital electric current data Vc, which are stored in the memory 21, and transmits the resulting data to the controller CNT. The system information stored in the memory 21 may be transmitted to the controller CNT through the communication unit 20.

The control signal transmitted from the controller CNT to the power storage module MOD1 is received by the communication unit 20. The received control signal is transmitted to each unit of the power storage module MOD1. The control signal received by the communication unit 20 is transmitted as appropriate to the cell voltage multiplexer 13, the cell temperature multiplexers 16, the ADC 14, the ADC 19, and the like. The control signal for a power storage module MOD at a higher level, such as the power storage module MOD2, is, for example, transmitted through the power storage module MOD1 at a lower level.

The memory 21 is, for example, formed of a non-volatile memory. The digital voltage data Vb that is supplied from the ADC 14 and the digital electric current data Vc that is supplied from the ADC 19 are stored in the memory 21. The digital temperature data T supplied from the ADC 14 may be stored in the memory 21. The system information may be stored in the memory 21. The system information is, for example, the resistance value of the electric current detection resistor 17, the impedance and an appropriate voltage value of the battery BAT before shipment. The system information, for example, may be detected when the use of the power storage module MOD starts, so that the detected system information is stored in the memory 21. The memory 21 may be formed of a plurality of memories.

A band gap reference (BGR) 22 generates a reference voltage for making a determination as to a logical level of 1 or 0 in the conversion process in the ADC 14 and the ADC 19. Electric power may be supplied from the battery BAT to the BGR 22 or may be supplied from an external power supply to the BGR 22.

A regulator (REG) 23 is connected to the line between the positive pole side of the battery BAT1 and the positive pole terminal 11. The regulator 23 is, for example, a series regulator. The regulator 23 steps down the voltage output from the battery BAT1 or the like so as to generate a voltage for operating each unit of the power storage module MOD1. The regulator 23 generates, for example, a voltage to be supplied to the above-mentioned BGR 22, and a voltage used to operate the control unit in a case where a control unit, such as a microcomputer, is provided within the power storage module MOD1. The regulator 23 generates, for example, a voltage of 3.3 to 5.0 V. A switch may be provided so that the voltage supplied from the regulator 23 and a voltage from the outside can be switched between.

A power shutdown switch 24 is connected to the line between the positive pole side of the battery BAT1 and the positive pole terminal 11. The power shutdown switch 24 is turned on at normal times, and is turned off when a fundamental abnormality occurs in the power storage module MOD1. For example, in a case where communication becomes not possible between the communication unit 20 and the controller CNT and in a case where the transmission of data becomes not possible between the ADC 14 and the communication unit 20, the power shutdown switch 24 is turned off, and the circuit of the power storage module MOD1 is cut off. The on/off control for the power shutdown switch 24 is performed by, for example, the controller CNT.

Operation of ADC

In the manner described above, the power storage module MOD in an embodiment includes the ADC 14 and the ADC 19 as two ADCs. Here, for the purpose of reference, a description will be given of an operation in a case where, unlike the present disclosure, the power storage module MOD is formed by one ADC (hereinafter, this ADC will be referred to as an ADC 30 as appropriate). The analog voltage data Vb output from the cell voltage multiplexer 13, and the analog electric current data Vc output from the electric current detection amplifier 18 are input to the ADC 30.

Figure 3:
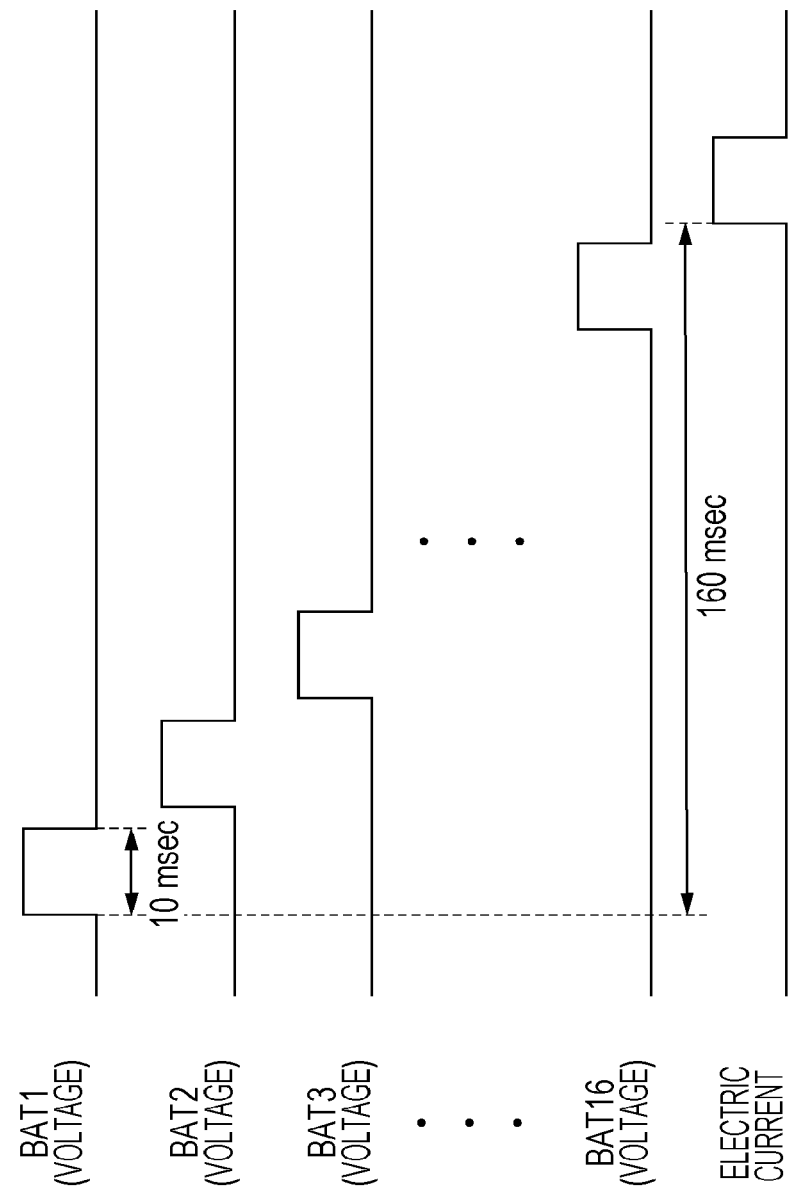
FIG. 3 is a schematic line diagram illustrating an example of a timing at which a voltage value for each battery, and an electric current value are detected.

FIG. 3 illustrates an example of a timing of the operation of the ADC 30. A control signal (obtaining instruction signal) is input to the control signal input terminal of the ADC 30. The analog voltage data Vb1 of the battery BAT1 is obtained by the ADC 30 in response to the obtaining instruction signal. The obtained analog voltage data Vb1 is converted into digital voltage data Vb1, and the converted digital voltage data Vb1 is output from the ADC 30. Similarly, the analog voltage data Vb2 to Vb16 of the batteries BAT2 to BAT16 are sequentially obtained by the ADC 30. The obtained analog voltage data Vb2 to Vb16 are converted into digital voltage data Vb2 to Vb16 by the ADC 30. The digital voltage data Vb2 to Vb16 are output from the ADC 30.

After all the analog voltage data Vb of the batteries BAT1 to BAT16 is converted into digital voltage data Vb by the ADC 30, the analog electric current data Vc is input to the input terminal of the ADC 30. The input analog electric current data Vc is converted into digital electric current data Vc by the ADC 30. The converted digital electric current data Vc is output from the ADC 30.

Here, if the processing time period during which the analog voltage data Vb per battery BAT is converted into digital voltage data Vb is set at, for example, 10 msec, the processing time period during which 16 analog voltage data Vb is converted into digital voltage data Vb is about 160 msec. As a result, at least an error of 160 msec occurs between the timing at which the analog voltage data Vb1 of the battery BAT1 is obtained by the ADC 30 and the timing at which the analog electric current data Vc is obtained by the ADC 30. As described above, when, for example, the impedance of the battery BAT1 is calculated by using the voltage value and the electric current value, which are detected at timings having an error, it is not possible to calculate an accurate impedance. A similar problem arises in the other batteries BAT.

In particular, in a case where, for example, an inverter circuit of a motor system with violent load variations is connected, it is demanded that an accurate voltage value and electric current value be detected, and an accurate impedance be calculated by following variations in load. However, in the manner described above, in one ADC 30, inevitably, an error occurs between the timing at which a voltage value is detected and the timing at which an electric current value is detected. For this reason, for example, the accurate impedance of the battery BAT is difficult to be calculated.

Figure 4:
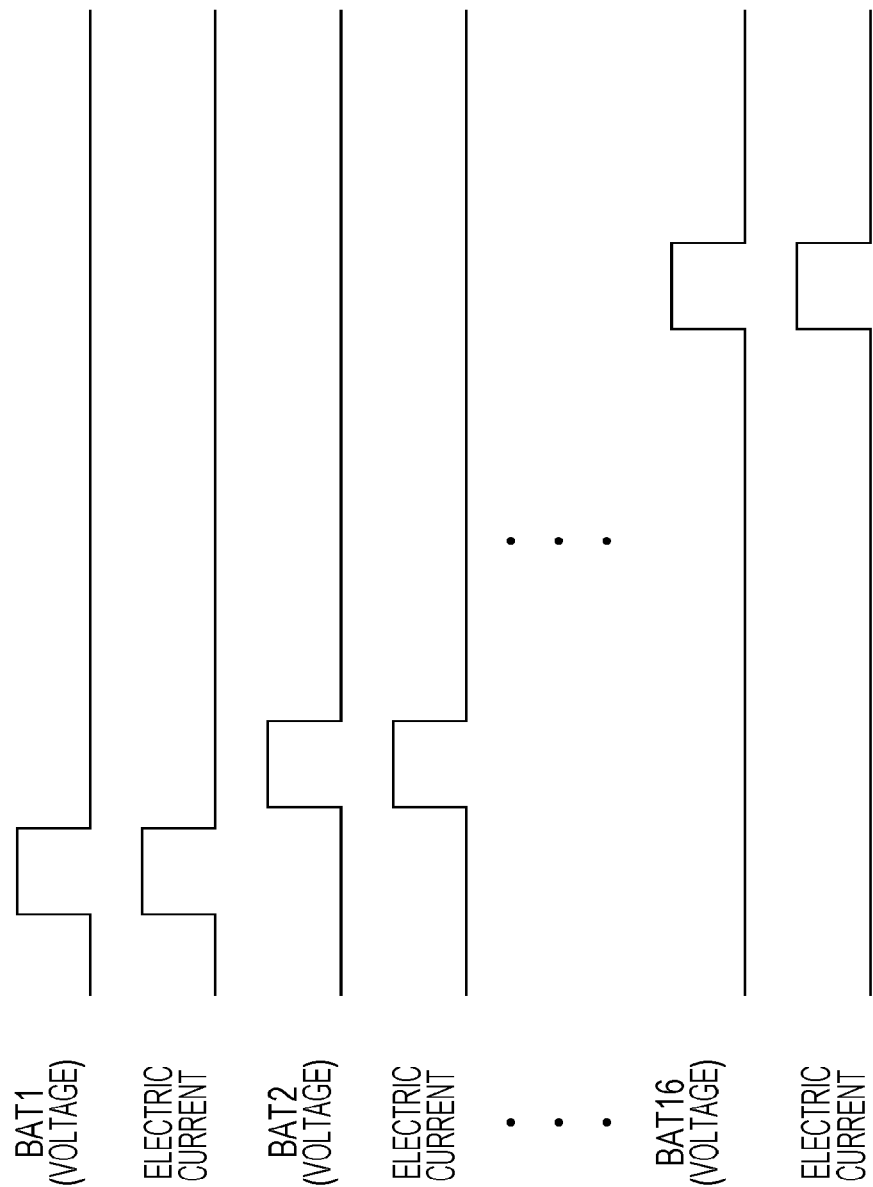
FIG. 4 is a schematic line diagram illustrating a timing at which a voltage value for each battery, and an electric current value are detected in an embodiment of the present disclosure.

Therefore, in an embodiment of the present disclosure, by using, for example, two ADCs, the detection of the voltage value and the detection of the electric current value for each battery BAT are performed simultaneously. FIG. 4 schematically shows the relationship between the timing of the detection of the electric current value and the timing of the detection of the voltage value for each battery BAT. FIG. 4 illustrates that, for example, the obtaining instruction signal of the analog voltage data Vb1 of the battery BAT1 is supplied to the ADC 14, the analog voltage data Vb1 is obtained by the ADC 14 and at the same time, the obtaining instruction signal of the analog electric current data Vc1 at that timing is supplied to the ADC 19, and the ADC 19 obtains the analog electric current data Vc1. This also applies to the other batteries BAT.

The operation will be described below in detail. Initially, a control signal is transmitted from the controller CNT to the power storage module MOD1. A control signal includes, for example, an obtaining instruction signal S1 for the ADC 14 and the ADC 19, and a channel switching signal ST1 for the cell voltage multiplexer 13. The transmitted control signal is received by the communication unit 20 of the power storage module MOD1. The received obtaining instruction signal S1 is supplied to the ADC 14 and the ADC 19. The channel switching signal ST1 is supplied to the cell voltage multiplexer 13.

The cell voltage multiplexer 13 switches to the channel specified using the channel switching signal ST1, and selects one analog voltage datum Vb. For example, the cell voltage multiplexer 13 selects the analog voltage data Vb1 of the battery BAT1. The selected analog voltage data Vb1 is output from the cell voltage multiplexer 13, and the output analog voltage data Vb1 is supplied to the ADC 14.

In response to the supplied obtaining instruction signal S1, the ADC 14 obtains the analog voltage data Vb1 supplied from the cell voltage multiplexer 13. The ADC 14 converts the obtained analog voltage data Vb1 into digital voltage data Vb1. The converted digital voltage data Vb1 is output from the ADC 14, and the output digital voltage data Vb1 is stored in the memory 21.

The ADC 19 obtains the analog electric current data Vc1 supplied from the electric current detection amplifier 18 in response to the supplied obtaining instruction signal S1. The ADC 19 converts the obtained analog electric current data Vc1 into digital electric current data Vc1. The converted digital electric current data Vc1 is output from the ADC 19, and the output digital electric current data Vc1 is stored in the memory 21. The digital voltage data Vb1 and the digital electric current data Vc1 are stored, for example, in such a manner as to be associated with each other.

Here, the ADC 14 and the ADC 19 have obtained the analog voltage data Vb1 and the analog electric current data Vc1 in response to the same obtaining instruction signal S1. That is, the analog voltage data Vb1 and the analog electric current data Vc1 are data having the same timing.

The timing at which the digital voltage data Vb1 is output from the ADC 14 and the timing at which the digital electric current data Vc1 is output from the ADC 19 are specified using a clock pulse that is input to the ADC 14 and the ADC 19. These two output timings may be coincident or different.

When the digital voltage data Vb1 and the digital electric current data Vc1 are stored in the memory 21, an ending signal is transmitted from the communication unit 20 to the controller 20. When the controller CNT receives the ending signal, the controller CNT transmits a control signal to the power storage module MOD1. This control signal includes, for example, an obtaining instruction signal S2 for the ADC 14 and the ADC 19, and a channel switching signal ST2 for the cell voltage multiplexer 13. The obtaining instruction signal S2 is supplied to the ADC 14 and the ADC 19, and the channel switching signal ST2 is supplied to the cell voltage multiplexer 13.

The cell voltage multiplexer 13 switches between the channels in response to the supplied channel switching signal ST2, and selects one analog voltage datum. The cell voltage multiplexer 13 selects the analog voltage data Vb2 of the battery BAT2. The selected analog voltage data Vb2 is output from the cell voltage multiplexer 13, and the output analog voltage data Vb2 is supplied to the ADC 14.

The ADC 14 obtains the analog voltage data Vb2 supplied from the cell voltage multiplexer 13 in response to the supplied obtaining instruction signal S2. The obtained analog voltage data Vb2 is converted into digital voltage data Vb2 by the ADC 14. The converted digital voltage data Vb2 is output from the ADC 14. The output digital voltage data Vb2 is stored in the memory 21.

The ADC 19 obtains the analog electric current data Vc2 supplied from the electric current detection amplifier 18 in response to the supplied obtaining instruction signal S2. The obtained analog electric current data Vc2 is converted into digital electric current data Vc2 by the ADC 19. The converted digital electric current data Vc2 is output from the ADC 19, and the output digital electric current data Vc2 is stored in the memory 21. Here, the ADC 14 and the ADC 19 have obtained the analog voltage data Vb2 and the analog electric current data Vc2 in response to the same obtaining instruction signal S2. That is, the analog voltage data Vb2 and the analog electric current data Vc2 are data having the same timing.

Similarly, in response to an obtaining instruction signal S3 from the controller CNT, the ADC 14 obtains the analog voltage data Vb3 of the battery BAT3. At the same time, the ADC 19 obtains the analog electric current data Vc3. The same processing is performed on the battery BAT4, the battery BAT5, . . . , and battery BAT16. The analog voltage data Vb of the individual batteries BAT is obtained by the ADC 14 and at the same time, the analog electric current data Vc at each timing is obtained in the respective timings.

When the conversion process on the analog voltage data Vb of all the batteries BAT is completed, in the memory 21, 16 digital voltage data Vb, and 16 digital electric current data Vc associated with the respective digital voltage data Vb are stored. The communication unit 20 performs, for example, time-division multiplexing on the digital voltage data Vb and the digital electric current data Vc, which are stored in the memory 21, and the transmits the resulting data 27 to the controller CNT.

As an example, an identifier (ID) 28 indicating the power storage module MOD1 is appended to the header 29 of the data 27 to be transmitted. After that, the data 27 on which the digital voltage data Vb1, the digital electric current data Vc1, the digital voltage data Vb2, the digital electric current data Vc2, . . . , digital voltage data Vb16, and the digital electric current data Vc16 have been multiplexed, is transmitted to the controller CNT. The resistance value of the electric current detection resistor 17 of the power storage module MOD1, and the system information, such as the impedance of each battery BAT before shipment, may be contained in the data 27 to be transmitted.

The controller CNT receives the data 27 transmitted from the communication unit 20, and performs processing corresponding to the received data 27. For example, the controller CNT calculates an electric current value by performing a computation operation using the digital electric current data Vc1 and the resistance value of the electric current detection resistor 17. Then, the controller CNT calculates the impedance of the battery BAT1 by using the calculated electric current value and the digital voltage data Vb1.

The controller CNT compares the calculated impedance with the impedance of the battery BAT1 before shipment, which has been transmitted from the power storage module MOD1, and obtains the degree of deterioration of the battery BAT1. The impedance of the battery BAT1 before shipment may be stored in the controller CNT.

The controller CNT calculates the degree of deterioration of the batteries BAT2 to BAT16 in a similar manner. Then, the controller CNT performs, for example, the above-mentioned cell balance process in accordance with the calculated degree of deterioration. The controller CNT may obtain the impedance of the most deteriorated battery BAT, and may obtain the deterioration rate of the power storage module MOD1 on the basis of the ratio with respect to the impedance before shipment. For the process for obtaining the degree of deterioration of each battery BAT, another technique of public knowledge can be adopted. In addition, the controller CNT may perform another process. For example, the controller CNT may calculate the SOC on the basis of the obtained impedance. For example, whether or not the digital voltage data Vb transmitted from the power storage module MOD1 is a value in an appropriate range may be determined by the controller CNT.

Here, the digital voltage data Vb and the digital electric current data Vc are data obtained by converting the analog voltage data Vb and the analog electric current data Vc at the same timing. Therefore, it is possible to obtain an accurate voltage value and electric current value at a certain timing. In addition, an impedance detection error resulting from a timing error (offset) does not occur, and an accurate impedance can be obtained.

Detection of Temperature

Figure 5:
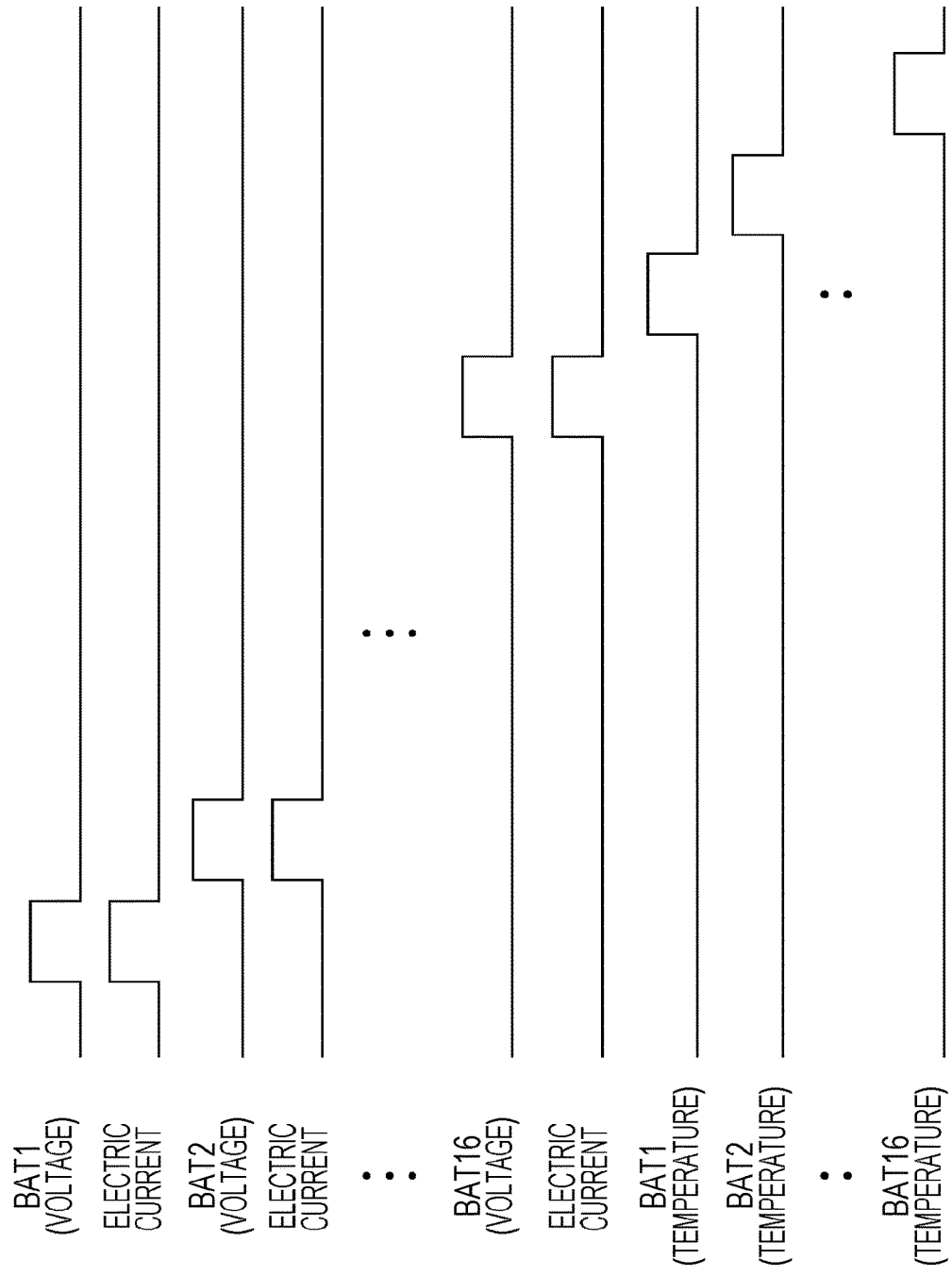
FIG. 5 is a schematic line diagram illustrating an example of a timing at which a voltage value for each battery, an electric current value, and a temperature for each battery are detected in an embodiment of the present disclosure.

As an example of a timing is shown in FIG. 5, a process for detecting a temperature may be performed.

After the above-mentioned process, a control signal is transmitted from the controller CNT to the power storage module MOD1. The control signal contains, for example, an obtaining instruction signal S17 for the ADC 14, and a channel switching signal ST17 for the cell temperature multiplexer 16. In response to the channel switching signal ST17, the cell temperature multiplexer 16 switches between the channels, and selects one analog temperature datum. For example, the analog temperature data T1 of the battery BAT1 is selected by the cell temperature multiplexer 16. The selected analog temperature data T1 is output from the output terminal of the ADC 14. The output analog temperature data T1 is supplied to the ADC 14.

In response to the obtaining instruction signal S17 from the controller CNT, the ADC 14 obtains the analog temperature data T1 supplied from the cell temperature multiplexer 16. The obtained analog temperature data T1 is converted into digital temperature data T1 by the ADC 14. For example, the analog temperature data T1 is converted into digital temperature data T1 of 14 to 18 bits. The converted digital temperature data T1 is output from the ADC 14, and the output digital temperature data T1 is stored in the memory 21.

After the digital temperature data T1 is stored in the memory 21, an ending signal is transmitted from the communication unit 20 to the controller CNT. When the controller CNT receives the ending signal, the controller CNT transmits the control signal to the power storage module MOD1. The control signal contains, for example, an obtaining instruction signal S18 for the ADC 14, and a channel switching signal ST18 for the cell temperature multiplexer 16.

The cell temperature multiplexer 16 switches between the channels in response to the channel switching signal ST18, and selects one analog temperature datum. For example, the analog temperature data T2 of the battery BAT2 is selected by the cell temperature multiplexer 16. The selected analog temperature data T2 is supplied to the ADC 14.

In response to the obtaining instruction signal S18 from the controller CNT, the ADC 14 obtains the analog temperature data T2 supplied from the cell temperature multiplexer 16. The obtained analog temperature data T2 is converted into digital temperature data T2 by the ADC 14. The converted digital temperature data T2 is output from the ADC 14, and the output digital temperature data T2 is stored in the memory 21. In a similar manner, the analog temperature data T3 to T16 of the batteries BAT3 to BAT16 are obtained. The obtained analog temperature data T3 to T16 are converted into digital temperature data T3 to T16, respectively. The converted digital temperature data T3 to T16 is stored in the memory 21.

The 16 digital temperature data T1 to T16 stored in the memory 21 are transmitted to the controller CNT by the communication unit 20. The digital temperature data T may be transmitted to the controller CNT together with the digital voltage data Vb and the digital electric current data Vb, and may be transmitted to the controller CNT separately from the digital voltage data Vb and the digital electric current data Vc. In addition, the 16 digital temperature data T may be transmitted individually at different timings.

The analog temperature data T may be detected at an interval longer than the interval at which the analog voltage data Vb is detected. For example, it is assumed that a process for reading the analog voltage data Vb is performed periodically and that a processing time period of 160 msec is taken to read the analog voltage data Vb of 16 batteries BAT. In this case, the detection of the analog temperature data T may be performed every 160 msec or may be performed every integral multiple of 160 msec.

The variation in the analog temperature data T of the battery BAT is small in comparison to the variation in the analog voltage data Vb of the battery BAT and the variation in the analog electric current data Vc flowing through the electric current path. For this reason, the necessity of detecting the analog temperature data T at the same time as the detection of the analog voltage data Vb is small. In the present disclosure, the analog temperature data T is detected after the analog voltage data Vb of all the batteries BAT is detected. Since the detection of the analog temperature data T is not performed at the same time as the detection of the analog voltage data Vb, it is not necessary to provide a dedicated ADC for converting the analog temperature data T into digital temperature data T. Therefore, the hardware-like configuration can be reduced, and costs can be reduced. In addition, the amount of electric power used can be suppressed.

2. Modification

In the foregoing, an embodiment of the present disclosure has been described. However, the present disclosure is not limited to the above-mentioned embodiment, and various modifications can be made. Modifications will be described below.

Figure 6:
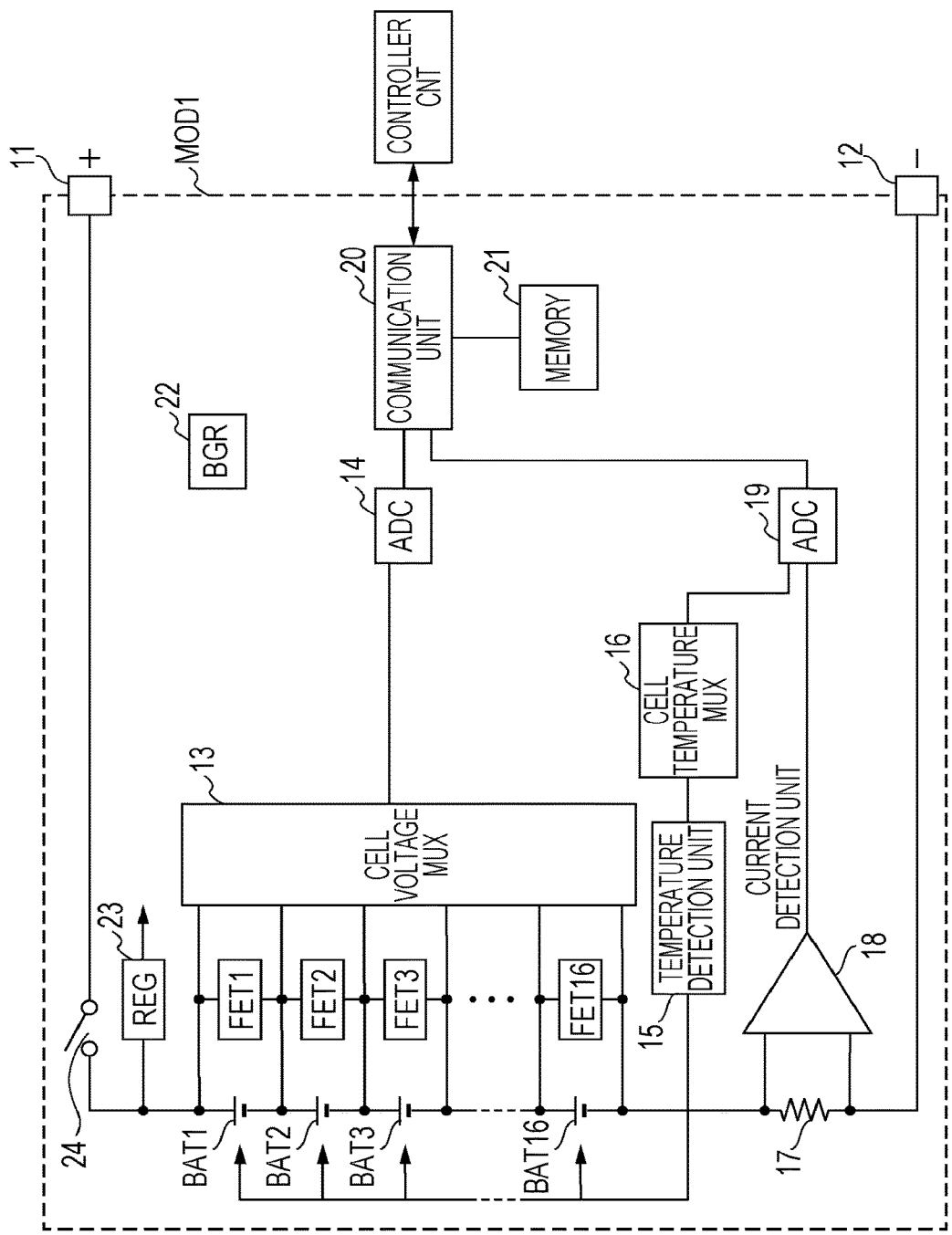
FIG. 6 is a block diagram illustrating an example of the configuration of a power supply apparatus in a modification of the present disclosure.

FIG. 6 illustrates an example of the configuration of a power storage module MOD in a modification. In FIG. 6, the power storage module MOD1 is used as an example. The power storage modules MOD2 to MOD6 are configured in the same way. In FIG. 6, the components, which are the same as those of the power storage module MOD1 in the embodiment, are designated with the same reference numerals.

As shown in FIG. 6, in the power storage module MOD1 in the modification, the analog temperature data T output from the cell temperature multiplexer 16 is output to the ADC 19. Then, the ADC 19 converts the analog temperature data T into digital temperature data T. The converted digital temperature data T is output from the ADC 19, and the output digital temperature data T is stored in the memory 21. As described above, the analog temperature data T output from the cell temperature multiplexer 16 may be supplied to the ADC 19. The processing performed by the power storage module MOD1 is the same as the processing of the power storage module MOD1 in the above-described embodiment.

Figure 7:
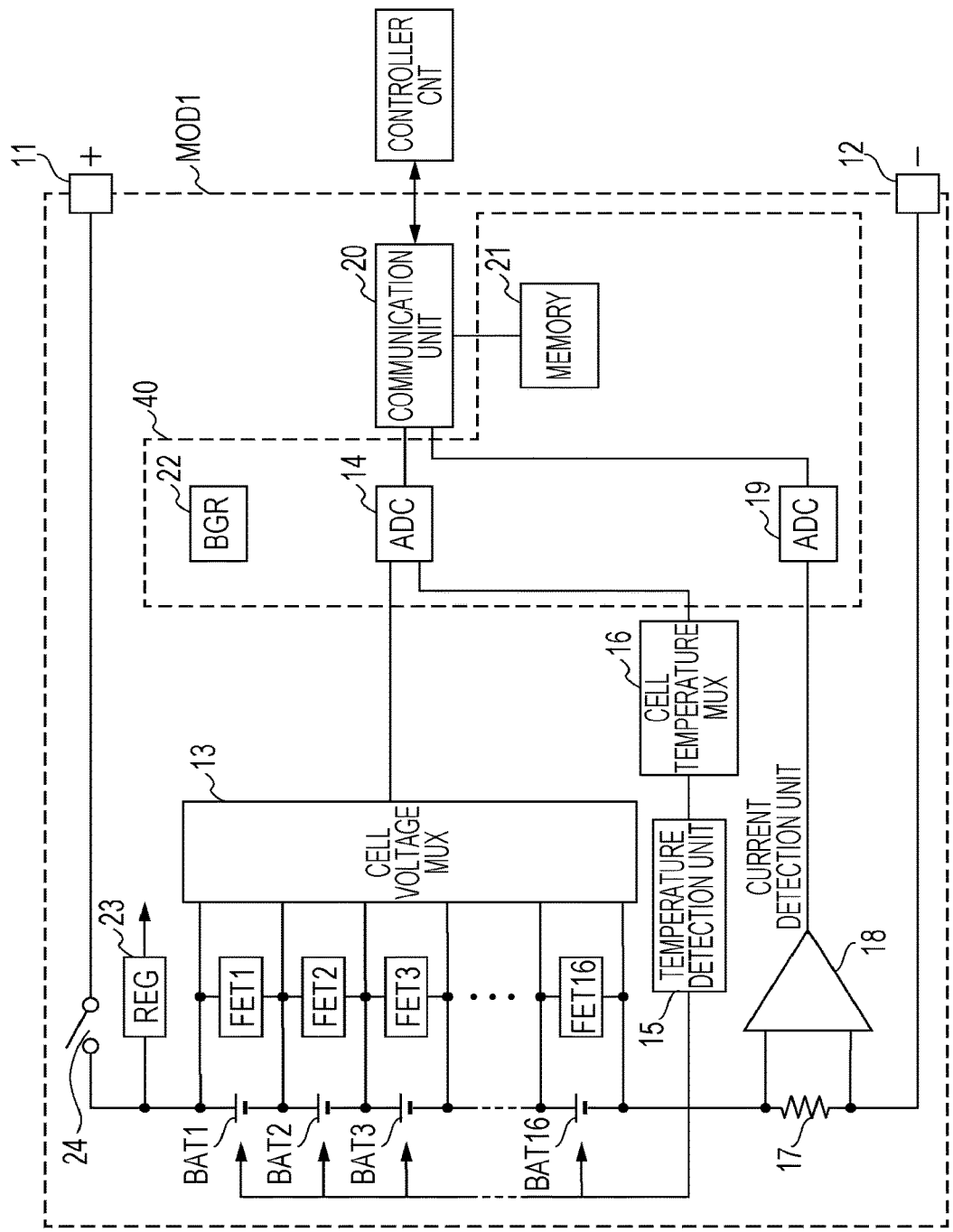
FIG. 7 is a block diagram illustrating an example of the configuration of a monitoring apparatus in the present disclosure.

The present disclosure can also be configured as a monitoring apparatus. For example, as shown in FIG. 7, the present disclosure can be configured as a monitoring apparatus 40 including at least the ADC 14 and the ADC 19. The monitoring apparatus 40 may include the memory 21. The function of the BGR 22 may be incorporated into each of the ADC 14 and the ADC 19. In the monitoring apparatus 40, the same processing as the processing in the above-described embodiment is performed.

Figure 8:
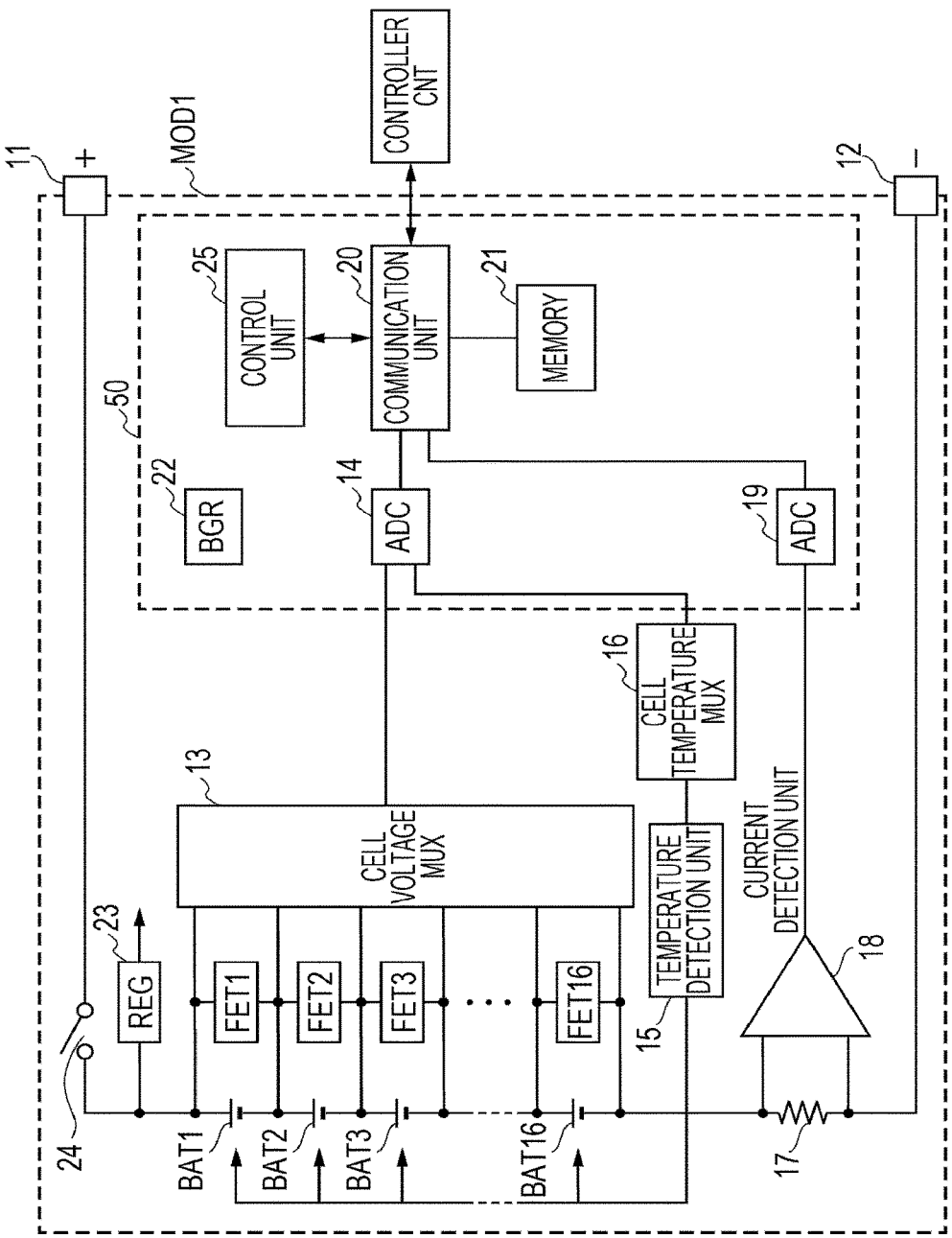
FIG. 8 is a block diagram illustrating an example of the configuration of a monitoring control apparatus in the present disclosure.

The present disclosure can also be configured as a monitoring control apparatus. For example, as shown in FIG. 8, the power storage module MOD1 is provided with a control unit 25. The control unit 25 may control the functions of the above-mentioned controller CNT. The control unit 25 may be configured as a monitoring control apparatus 50 including at least the ADC 14, the ADC 19, and the control unit 25. The monitoring control apparatus 50 may include the memory 21. The monitoring control apparatus 50 may include the communication unit 20.

In addition, the control unit 25 may directly control the ADC 14, the ADC 19, and the memory 21 without using the communication unit 20. In addition, the control unit 25 can also be configured as a power storage module MOD including at least a plurality of batteries BAT, the ADC 14, the ADC 19, and the control unit 25. In addition, the control unit 25 may be formed as a one-chip IC (Integrated Circuit), so that the functions of the ADC 14, the ADC 19, the memory 21, and the like are incorporated into the control unit 25. In the monitoring control apparatus 50, the same processing as the above-described embodiment is performed.

In the above-described embodiment and modification, the digital voltage data Vb, the digital electric current data Vc, and the digital temperature data T may be transmitted to the controller CNT without being stored in the memory 21.

In the above-described embodiment and modification, a computation operation for obtaining an electric current value by using a voltage value across the electric current detection resistor 17 and the resistance value of the electric current detection resistor 17 is performed by the controller CNT. Alternatively, the computation operation may be performed by the power storage module MOD.

In the above-described embodiment and modification, the analog temperature data T is obtained after the analog voltage data Vb of 16 batteries BAT is detected. Alternatively, the analog temperature data T may be obtained intermittently. For example, the analog temperature data T may be obtained at a timing between the timing at which the analog voltage data Vb1 of the battery BAT1 is obtained and the timing at which the analog voltage data Vb2 of the battery BAT2 is obtained.

In the above-described embodiment and modification, 16 digital voltage data Vb and 16 digital electric current data Vc are collectively transmitted to the controller CNT. Alternatively, individual digital voltage data Vb and individual digital electric current data Vc may be transmitted. For example, when an ending signal is transmitted from the communication unit 20 to the controller CNT, individual digital voltage data Vb and digital electric current data Vc (for example, the digital voltage data Vb1 and the digital electric current data Vc1) may be transmitted at the same time as for the ending signal.

In the above-described embodiment and modification, the content of communication performed between the power storage module MOD and the controller CNT can be changed as appropriate. For example, in response to the obtaining instruction signal from the controller CNT, the digital voltage data Vb and the digital electric current data Vc of the respective batteries BAT are sequentially obtained at a predetermined interval. The obtained digital voltage data Vb and digital electric current data Vc are stored in the memory 21, and the stored digital voltage data Vb and digital electric current data Vc may be transmitted to the controller CNT.

In the above-described embodiment and modification, in a case where the batteries BAT are formed by a battery block, the voltage values of the individual batteries forming the battery block are measured and at the same time, the electric current value flowing through a plurality of battery blocks are measured.

The configuration the processing in the embodiment and modification can be combined as appropriate in a range in which a technological contradiction does not occur. In addition, the processing in the above-described embodiment and modification can be configured as a monitoring method and a monitoring control method. In addition, the processing can be configured as a program that is executed by the control unit or the like or as a recording medium on which the program is recorded.

3. Application Example

A description will be given below of an application example of a power storage module MOD. The application example of the power storage module MOD is not limited to the application example which will be described below.

Power Storage System in House as Application Example

Figure 9:
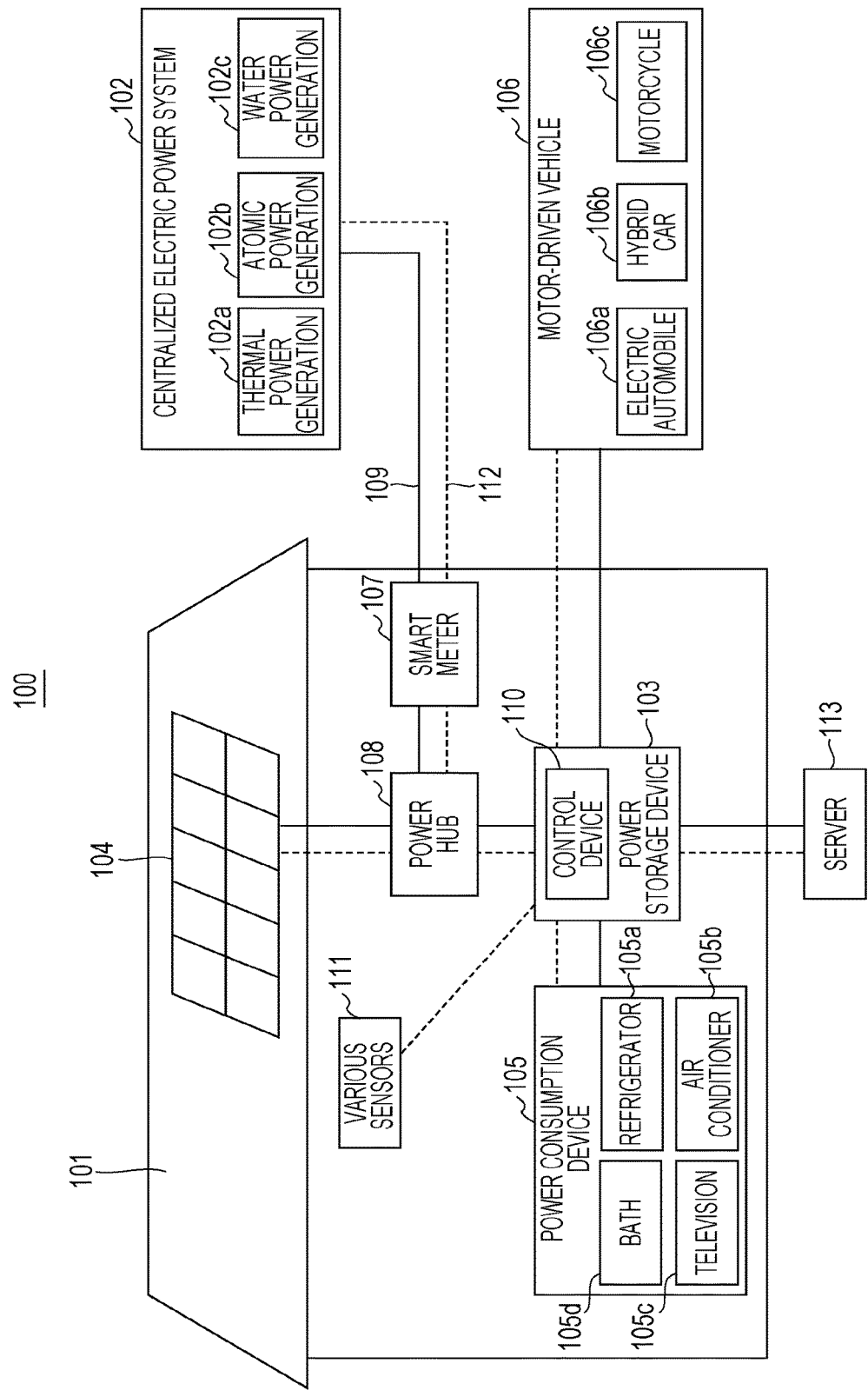
FIG. 9 is a block diagram illustrating an application example of a power supply apparatus in the present disclosure.

A description will be given, with reference to FIG. 9, of an example in which the present disclosure is applied to a power storage system for a house. For example, in a power storage system 100 for a house 101, electric power is supplied from a centralized power system 102, such as thermal power generation 102a, atomic power generation 102b, and wind power generation 102c, to a power storage apparatus 103 through an electric power network 109, an information network 112, a smart meter 107, a power hub 108, and the like. Along with this, electric power is supplied to the power storage apparatus 103 from an independent power supply, such as an in-house power generation device 104.

The electric power supplied to the power storage apparatus 103 is stored. By using the power storage apparatus 103, electric power to be used in the house 101 is supplied. Not limited to the house 101, the same power storage system can be used with regard to a building.

The house 101 is provided with the power generation device 104, a power consumption device 105, the power storage apparatus 103, a control device 110 that controls each device, a smart meter 107, and sensors 111 that obtain various information. The devices are connected to one another through the electric power network 109 and the information network 112. For the power generation device 104, a solar battery, a fuel battery, a windmill, or the like is used, and the generated electric power is supplied to the power consumption device 105 and/or the power storage apparatus 103. Examples of the power consumption device 105 include a refrigerator 105a, an air-conditioning device 105b, a television receiver 105c, and a bath 105d. In addition, the power consumption device 105 includes a motor-driven vehicle 106. Examples of the motor-driven vehicle 106 include an electric automobile 106a, a hybrid car 106b, and a motorcycle 106c. The motor-driven vehicle 106 may be a motor-assisted bicycle or the like.

The above-mentioned power storage apparatus of the present disclosure is applied to the power storage apparatus 103. The power storage apparatus 103 is constituted by a secondary battery or a capacitor. The power storage apparatus 103 is, for example, constituted by a lithium-ion battery. The lithium-ion battery may be of a stationary type or may be that used in the motor-driven vehicle 106. The smart meter 107 has functions of measuring the amount of commercial electric power used and transmitting the measured use amount to an electric power company. The electric power network 109 may be any one of DC power supply, AC power supply, and noncontact supply of electric power, or may be such that two or more of them are combined.

Examples of various sensors 111 include a human detection sensor, an illumination sensor, an object detection sensor, a power consumption sensor, a vibration sensor, a contact sensor, a temperature sensor, and an infrared sensor. The information obtained by the various sensors 111 is transmitted to the control device 110. The state of the weather conditions, the state of a person, and the like are understood on the basis of the information from the sensors 111, and the power consumption device 105 can be automatically controlled to minimize energy consumption. In addition, it is possible for the control device 110 to transmit information on the house 101 to an external electric power company and the like through the Internet.

Processing, such as branching of electric power lines and DC/AC conversion, is performed by using the power hub 108. Examples of a communication scheme for the information network 112 that is connected with the control device 110 include a method of using a communication interface, such as UART (Universal Asynchronous Receiver-Transceiver: transmission/reception circuit for asynchronous serial communication), and a method of using a sensor network based on a wireless communication standard, such as Bluetooth, ZigBee, or WiFi. The Bluetooth method can be applied to multimedia communication, so that one-to-many connection communication can be performed. ZigBee uses the physical layer of IEEE (Institute of Electrical and Electronics Engineers) 802.16.4. IEEE 802.16.4 is the title of the short-distance wireless network standard called PAN (Personal Area Network) or W (Wireless) PAN.

The control device 110 is connected to an external server 113. The server 113 may be managed by one of the house 101, an electric power company, and a service provider. The information that is transmitted and received by the server 113 is, for example, information on power consumption information, life pattern information, an electric power fee, weather information, natural disaster information, and electricity transaction. These pieces of information may be transmitted and received from a power consumption device (for example, television receiver) inside a house. Alternatively, the pieces of information may be transmitted and received from an out-of-home device (for example, a mobile phone, etc.). These pieces of information may be displayed on a device having a display function, for example, a television receiver, a mobile phone, or a personal digital assistant (PDA).

The control device 110 that controls each unit is constituted by a central processing unit (CPU), a random access memory (RAM), a read only memory (ROM), and the like. In this example, the control device 110 is stored in the power storage apparatus 103. The control device 110 is connected to the power storage apparatus 103, the in-house power generation device 104, the power consumption device 105, the various sensors 111, and the server 113 through the information network 112, and has functions of adjusting the amount of the commercial electric power used, and the amount of electric power generated. In addition, the control device 110 may have a function of performing electricity transaction in the electric power market.

As described above, not only the centralized power system 102 in which power is thermal power 102a, atomic power 102b, wind power 102c, or the like, but also the generated power of the in-house power generation device 104 (solar power generation, wind power generation) can be stored in the power storage apparatus 103. Therefore, even if the generated power of the in-house power generation device 104 varies, it is possible to perform control such that the amount of electric power to be sent to the outside is made constant or electric discharge is performed by only a necessary amount. For example, usage is possible in which electric power obtained by solar power generation is stored in the power storage apparatus 103, late-night electric power whose fee is low during night time is stored in the power storage apparatus 103, and the electric power stored by the power storage apparatus 103 is discharged and used in a time zone in which the fee during daytime is high.

In this example, an example has been described in which the control device 110 is stored in the power storage apparatus 103. Alternatively, the control device 110 may be stored in the smart meter 107 or may be configured singly. In addition, the power storage system 100 may be used by targeting a plurality of houses in a block of apartments or may be used by targeting a plurality of single-family detached houses.

Power Storage System in Vehicle as Application Example

Figure 10:
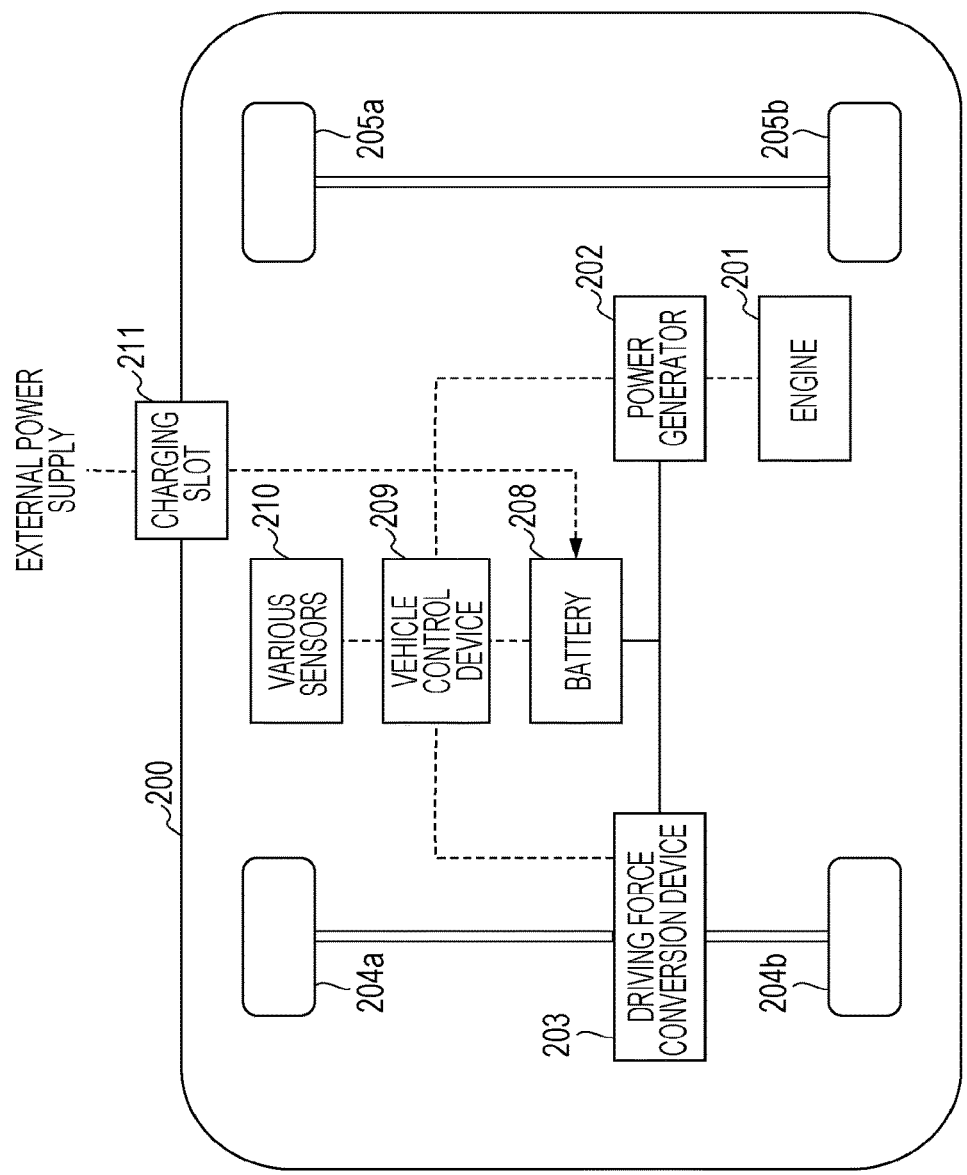
FIG. 10 is a block diagram illustrating another application example of the power supply apparatus in the present disclosure.
Figure 11:
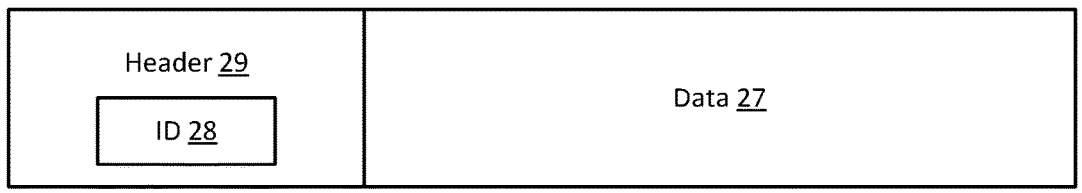
FIG. 11 is a block diagram illustrating an example of a header appended to data to be transmitted.

A description will be given, with reference to FIG. 10, of an example in which the present disclosure is applied to a power storage system for vehicles. FIG. 10 schematically shows an example of the configuration of a hybrid vehicle adopting a series hybrid power system to which the present disclosure is applied. Such a series hybrid power system is a car that runs using an electric power driving force transducer by using electric power generated by a power generator that is driven by an engine or by using electric power that is temporarily stored in a battery.

A hybrid vehicle 200 is mounted with an engine 201, a power generator 202, an electric power driving force transducer 203, a driving wheel 204a, a driving wheel 204b, a wheel 206a, a wheel 206b, a battery 208, a vehicle control device 209, various sensors 210, and a charging slot 211. The above-mentioned power storage apparatus of the present disclosure is applied to the battery 208.

The hybrid vehicle 200 runs by using the electric power driving force transducer 203 as a power source. An example of the electric power driving force transducer 203 is a motor. The electric power driving force transducer 203 operates using the electric power of the battery 208, and the rotational force of the electric power driving force transducer 203 is transferred to the driving wheels 204a and 204b. By using direct current-alternating current (DC-AC) or inverse conversion (AC-DC conversion) at a necessary place, the electric power driving force transducer 203 can use any of an AC motor and a DC motor. The various sensors 210 control the engine rotation speed through the vehicle control device 209 or controls the opening (throttle opening) of a throttle valve (not shown). The various sensors 210 include a speed sensor, an acceleration sensor, an engine rotation speed sensor, and the like.

The rotational force of the engine 201 is transferred to the power generator 202, and the electric power generated by the power generator 202 by using the rotational force can be stored in the battery 208.

When the hybrid vehicle decelerates by a braking mechanism (not shown), the resistance force at the time of the deceleration is added as a rotational force to the electric power driving force transducer 203, and the regenerative electric power that is generated by the electric power driving force transducer 203 by using the rotational force is stored in the battery 208.

The battery 208, as a result of being connected to an external power supply of the hybrid vehicle, receives supply of electric power by using a charging slot 211 as an input slot from the external power supply, and can store the received electric power.

Although not shown in the figures, the present disclosure may include an information processing apparatus that performs information processing for vehicle control on the basis of information on a secondary battery. Examples of such information processing apparatuses include an information processing apparatus that performs display of the remaining amount of a battery on the basis of the information on the remaining amount of the battery.

In the foregoing, a description has been given by using, as an example, a series hybrid car that runs using a motor by using electric power generated by a power generator that is driven by an engine or by using electric power that was temporarily stored in a battery. However, the present disclosure can be effectively applied to a parallel hybrid car in which the outputs of both the engine and the motor are used as a driving source and in which switching between three methods, that is, running using only an engine, running using only a motor, and running using an engine and a motor, is performed as appropriate. In addition, the present disclosure can be effectively applied to a so-called motor-driven vehicle that runs by being driven using only a driving motor without using an engine.

The present disclosure can take the following configurations.

(1) A monitoring apparatus including:
a first converter that converts first analog data indicating a voltage value of each of batteries into first digital data; and
a second converter that converts second analog data indicating an electric current value flowing through the plurality of batteries into second digital data,
wherein the first analog data and the second analog data are data having the same timing.

(2) The monitoring apparatus as set forth in the above (1),
wherein third analog data indicating a temperature of a plurality of batteries or each battery is detected at an interval longer than an interval at which the first analog data is detected, and wherein the third analog data is supplied to one of the first and second converters.

(3) The monitoring apparatus as set forth in the above (1) or (2), further including a storage unit that stores the first digital data and the second digital data.

(4) The monitoring apparatus as set forth in any of the above (1) to (3), further including a communication unit that transmits the first digital data and the second digital data to the outside.

(5) A monitoring control apparatus including:
a first converter that converts first analog data indicating a voltage value of each of batteries into first digital data;
a second converter that converts second analog data indicating an electric current value flowing through the plurality of batteries into second digital data; and
a control unit that performs control corresponding to the first digital data supplied from the first converter, and the second digital data supplied from the second converter,
wherein the first analog data and the second analog data are data having the same timing.

(6) The monitoring control apparatus as set forth in the above (5),
wherein third analog data indicating a temperature of a plurality of batteries or each battery is detected at an interval longer than an interval at which the first analog data is detected, and
wherein the third analog data is supplied to one of the first and second converters.

(7) A power supply apparatus including:
a plurality of batteries;
a first converter that converts first analog data indicating a voltage value of each of the batteries into first digital data; and
a second converter that converts second analog data indicating an electric current value flowing through the plurality of batteries into second digital data, and
wherein the first analog data and the second analog data are data having the same timing.

(8) A power supply apparatus including:
a plurality of batteries;
a first converter that converts first analog data indicating a voltage value of each of batteries into first digital data;
a second converter that converts second analog data indicating an electric current value flowing through the plurality of batteries into second digital data; and
a control unit that performs control corresponding to the first digital data supplied from the first converter, and the second digital data supplied from the second converter,
wherein the first analog data and the second analog data are data having the same timing.

(9) A monitoring method for use with a monitoring apparatus including a first converter and a second converter, the monitoring method including:
converting, by using the first converter, first analog data indicating a voltage value of each of batteries into first digital data; and
converting, by using the second converter, second analog data indicating an electric current value flowing through the plurality of batteries into second digital data, and
wherein the first analog data and the second analog data are data having the same timing.

(10) A monitoring control method for use with a monitoring apparatus including a first converter, a second converter, and a control unit, the monitoring control method including:
converting, by using the first converter, first analog data indicating a voltage value of each of batteries into first digital data; and
converting, by using the second converter, second analog data indicating an electric current value flowing through the plurality of batteries into second digital data; and
performing, by using the control unit, control corresponding to the first digital data supplied from the first converter, and the second digital data supplied from the second converter,
wherein the first analog data and the second analog data are data having the same timing.

(11) A power storage system including:
one or more power supply apparatuses according to the above 7 or 8, wherein the one or more power supply apparatuses are charged by a power generation device that performs electric power generation from reproducible energy.

(12) A power storage system including:
one or more power supply apparatuses according to the above 7 or 8, wherein electric power is supplied to an electronic apparatus connected to the one or more power supply apparatuses.

(13) An electronic apparatus including:
one or more power supply apparatuses according to the above 7 or 8, wherein supply of electric power is received from the one or more power supply apparatuses.

(14) A motor-driven vehicle including:
one or more power supply apparatuses according to the above 7 or 8, a conversion device that receives supply of electric power from the one or more power supply apparatuses and that converts the electric power into a driving force of the vehicle, and a control device that performs information processing regarding vehicle control on the basis of the information on the one or more power supply apparatuses.

(15) An electric power system including:
one or more power supply apparatuses according to the above 7 or 8; and
an electric power information transmitting/receiving unit that transmits and receives a signal to and from another device via a network,
wherein charging/discharging control of the one or more power supply apparatuses is performed on the basis of the information received by the electric power information transmitting/receiving unit.

(16) An electric power system including:
one or more power supply apparatuses according to the above 7 or 8,
wherein supply of electric power is received from the one or more power supply apparatuses, or electric power is supplied from a power generation device or an electric power network to the one or more power supply apparatuses.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A monitoring apparatus comprising:
a first converter that converts first analog data indicating a voltage value of each battery of a plurality of batteries in a power storage module into first digital data; and a second converter that converts second analog data indicating an electric current value flowing through the plurality of batteries in the power storage module into second digital data, wherein the first analog data and the second analog data are data having the same timing, and wherein third analog data indicating a temperature of the plurality of batteries or each battery is detected at an interval longer than an interval at which the first analog data is detected.

2. The monitoring apparatus according to claim 1, wherein the third analog data is supplied to one of the first and second converters.

3. The monitoring apparatus according to claim 1, further comprising a storage unit that stores the first digital data and the second digital data.

4. The monitoring apparatus according to claim 1, further comprising a communication unit that transmits the first digital data and the second digital data to the outside.

5. A monitoring control apparatus comprising:

a first converter that converts first analog data indicating a voltage value of each battery of a plurality of batteries in a power storage module into first digital data;

a second converter that converts second analog data indicating an electric current value flowing through the plurality of batteries in the power storage module into second digital data; and a control unit that performs control of the power storage module corresponding to the first digital data supplied from the first converter and the second digital data supplied from the second converter, wherein the first analog data and the second analog data are data having the same timing, and wherein third analog data indicating a temperature of the plurality of batteries or each battery is detected at an interval longer than an interval at which the first analog data is detected.

6. The monitoring control apparatus according to claim 5, wherein the third analog data is supplied to one of the first and second converters.

7. A power supply apparatus comprising:

a plurality of batteries in a power storage module;

a first converter that converts first analog data indicating a voltage value of each of the plurality of batteries in the power storage module into first digital data; and a second converter that converts second analog data indicating an electric current value flowing through the plurality of batteries in the power storage module into second digital data, wherein the first analog data and the second analog data are data having the same timing, and wherein third analog data indicating a temperature of the plurality of batteries or each battery is detected at an interval longer than an interval at which the first analog data is detected.

8. A power supply apparatus comprising:

a plurality of batteries in a power storage module;

a first converter that converts first analog data indicating a voltage value of each of the plurality of batteries in the power storage module into first digital data;

a second converter that converts second analog data indicating an electric current value flowing through the plurality of batteries in the power storage module into second digital data; and a control unit that performs control of the power storage module corresponding to the first digital data supplied from the first converter and the second digital data supplied from the second converter, wherein the first analog data and the second analog data are data having the same timing, and wherein third analog data indicating a temperature of the plurality of batteries or each battery is detected at an interval longer than an interval at which the first analog data is detected.

9. A monitoring method for use with a monitoring apparatus including a first converter and a second converter, the monitoring method comprising:

converting, by using the first converter, first analog data indicating a voltage value of each of a plurality of batteries in a power storage module into first digital data; and converting, by using the second converter, second analog data indicating an electric current value flowing through the plurality of batteries in a power storage module into second digital data, wherein the first analog data and the second analog data are data having the same timing, and wherein third analog data indicating a temperature of the plurality of batteries or each battery is detected at an interval longer than an interval at which the first analog data is detected.

10. A monitoring control method for use with a monitoring apparatus including a first converter, a second converter, and a control unit, the monitoring control method comprising:

converting, by using the first converter, first analog data indicating a voltage value of each of a plurality of batteries in a power storage module into first digital data;

converting, by using the second converter, second analog data indicating an electric current value flowing through the plurality of batteries in a power storage module into second digital data; and performing, by using the control unit, control of the power storage module corresponding to the first digital data supplied from the first converter and the second digital data supplied from the second converter, wherein the first analog data and the second analog data are data having the same timing, and wherein third analog data indicating a temperature of the plurality of batteries or each battery is detected at an interval longer than an interval at which the first analog data is detected.

11. A power storage system comprising:

one or more power supply apparatuses according to claim 7, wherein the one or more power supply apparatuses are charged by a power generation device that performs electric power generation from reproducible energy.

12. A power storage system comprising:

one or more power supply apparatuses according to claim 7, wherein electric power is supplied to an electronic apparatus connected to the one or more power supply apparatuses.

13. An electronic apparatus comprising:

one or more power supply apparatuses according to claim 7, wherein supply of electric power is received from the one or more power supply apparatuses.

14. A motor-driven vehicle comprising:

one or more power supply apparatuses according to claim 7, a conversion device that receives supply of electric power from the one or more power supply apparatuses and that converts the electric power into a driving force of the vehicle, and a control device that performs information processing regarding vehicle control on the basis of the information on the one or more power supply apparatuses.

15. An electric power system comprising:
one or more power supply apparatuses according to claim 7; and
an electric power information transmitting/receiving unit that transmits and receives a signal to and from another device via a network,
wherein charging/discharging control of the one or more power supply apparatuses is performed on the basis of the information received by the electric power information transmitting/receiving unit.

16. An electric power system comprising:
one or more power supply apparatuses according to claim 7,
wherein supply of electric power is received from the one or more power supply apparatuses, or electric power is supplied from a power generation device or an electric power network to the one or more power supply apparatuses.

17. The monitoring apparatus according to claim 1,
wherein an identifier indicating the power storage module from a plurality of power storage modules is appended to a header of digital data to be transmitted from the power storage module to outside the power storage module.

18. The monitoring control apparatus according to claim 5,
wherein an identifier indicating the power storage module from a plurality of power storage modules is appended to a header of digital data to be transmitted from the power storage module to outside the power storage module.

19. A power storage system according to claim 7,
wherein an identifier indicating the power storage module from a plurality of power storage modules is appended to a header of digital data to be transmitted from the power storage module to outside the power storage module.

20. A power supply apparatus according to claim 8,
wherein an identifier indicating the power storage module from a plurality of power storage modules is appended to a header of digital data to be transmitted from the power storage module to outside the power storage module.

* * * * *